(12) United States Patent
Patterson et al.

(10) Patent No.: US 8,399,281 B1
(45) Date of Patent: *Mar. 19, 2013

(54) TWO BEAM BACKSIDE LASER DICING OF SEMICONDUCTOR FILMS

(75) Inventors: Daniel G. Patterson, Morgan Hill, CA (US); Laila Mattos, Palo Alto, CA (US)

(73) Assignee: Alta Devices, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/222,617

(22) Filed: Aug. 31, 2011

(51) Int. Cl.
H01L 21/78 (2006.01)

(52) U.S. Cl. .................. 438/68; 438/462; 219/121.72

(58) Field of Classification Search .............. 438/68, 438/462, 57
See application file for complete search history.

(56) References Cited

U.S. PATENT DOCUMENTS

| | | | |
|---|---|---|---|
| 6,586,707 B2* | 7/2003 | Boyle et al. ............... 219/121.69 |
| 6,781,093 B2* | 8/2004 | Conlon et al. ........... 219/121.72 |
| 6,841,482 B2* | 1/2005 | Boyle ............................ 438/708 |
| 6,849,524 B2 | 2/2005 | Shelton et al. |
| 6,887,804 B2* | 5/2005 | Sun et al. ...................... 438/130 |
| 7,545,843 B2* | 6/2009 | Armani et al. .................. 372/92 |
| 7,772,090 B2 | 8/2010 | Starkston et al. |
| 7,776,720 B2* | 8/2010 | Boyle et al. ................... 438/463 |
| 7,804,043 B2 | 9/2010 | Deshi |
| 2002/0086137 A1 | 7/2002 | Brouillette et al. |
| 2004/0112880 A1* | 6/2004 | Sekiya ..................... 219/121.69 |
| 2005/0087522 A1* | 4/2005 | Sun et al. ................. 219/121.71 |
| 2006/0068581 A1* | 3/2006 | Kobayashi .................... 438/622 |
| 2006/0126677 A1* | 6/2006 | Sun et al. ......................... 372/30 |
| 2007/0272666 A1* | 11/2007 | O'Brien et al. ........... 219/121.69 |
| 2007/0272668 A1 | 11/2007 | Albelo et al. |
| 2008/0070378 A1 | 3/2008 | Yeo |
| 2008/0220590 A1 | 9/2008 | Miller et al. |
| 2009/0017600 A1* | 1/2009 | Kirihara et al. ............... 438/462 |
| 2009/0191690 A1* | 7/2009 | Boyle et al. ................... 438/462 |
| 2010/0009550 A1* | 1/2010 | Tsujikawa et al. ............ 438/798 |
| 2010/0099238 A1 | 4/2010 | Vakanas et al. |
| 2010/0213367 A1* | 8/2010 | Miller ........................... 250/282 |
| 2010/0219509 A1 | 9/2010 | He et al. |
| 2010/0279490 A1 | 11/2010 | Starkston et al. |
| 2010/0294347 A1* | 11/2010 | Zimmer et al. ............... 136/252 |
| 2011/0030758 A1* | 2/2011 | Kiriyama ...................... 136/244 |
| 2011/0177674 A1* | 7/2011 | Rodin et al. .................. 438/460 |

* cited by examiner

*Primary Examiner* — Savitr Mulpuri
(74) *Attorney, Agent, or Firm* — Schneck & Schneck; Thomas Schneck

(57) ABSTRACT

A method and system for dicing semiconductor devices from a semiconductor film. A semiconductor film, backed by a metal layer, is bonded by an adhesive layer to a flexible translucent substrate. Reference features on the film are used to describe a cutting path like a scribe line. An infrared laser beam is aligned to the scribe lines from the back surface of the flexible substrate. The infrared laser beam cuts through the flexible substrate and the majority of the thickness of the adhesive layer, cutting a first trough of a backside street along a scribe line defined by the reference features. An ultraviolet laser beam is aligned to the backside street, or to the scribe line as mapped to the back surface of the flexible substrate. The ultraviolet laser cuts through the metal layer and the semiconductor film, cutting a second trough along the scribe line. The second trough extends from the bottom of and deepens the first trough, cutting through the semiconductor film.

11 Claims, 5 Drawing Sheets

TWO BEAM BACKSIDE LASER DICING OF SEMICONDUCTOR FILMS

TECHNICAL FIELD

The field of the present invention relates to semiconductor substrate dicing by laser radiation.

BACKGROUND

Traditional methods or systems for scribing, cutting and separating semiconductor devices from a semiconductor wafer, i.e. dicing, rely on cutting a street defined by a scribe line, using a diamond saw or a laser. In throughcutting, a single pass is made using the diamond saw or laser, cutting all the way through the wafer. In another technique, known as wafer fracturing, die separation is performed by cutting along a street partially through the thickness of the wafer, then cracking the wafer along the street and separating the dice. A scribe line can be expressed or delineated physically on the wafer, using scribe line geometries that are photolithographically deposited using one or more layers on the wafer, such as by using photoresist and etching. A scribe line can be physically delineated on the wafer by laser ablation of the wafer surface. Alternatively, a scribe line can be defined on the wafer in the abstract, for example using data in a computer memory, as a path along which a street is to be cut where only a reference feature on the wafer is needed. Whether or not a scribe line is physically delineated on a wafer, the scribe line can be expressed as a set of coordinates relative to a reference feature on the wafer.

Mechanical cutting of semiconductor wafers can cause cracks, splitting, damage to PN junctions (also known as p-n junctions) and other effects on the wafers and devices being fabricated on the wafers. The width of the street and the corresponding amount of material removed represents wasted area of the wafer. It is desired to minimize the width of the street and minimize the wasted area of the wafer, thereby minimizing the cost per die produced.

Laser cutting generally produces a narrower street than diamond saw cutting. However, local heating from laser cutting can damage PN junctions. Combining a semiconductor wafer with one or more additional materials poses additional challenges to laser cutting or mechanical cutting.

Standard silicon wafers are nominally 275 microns to 775 microns thick, although additional sizes have been and are being developed. Thin wafers are nominally 100 microns to 150 microns thick. Ultrathin wafers can support thin films of nanometer or monolayer thicknesses and be up to several microns thick. Thin wafers or ultrathin wafers may need additional support during fabrication and handling, which poses challenges to laser cutting or mechanical cutting.

Solar cells, also known as photovoltaic cells, can be made from silicon wafers or from thin films, such as gallium arsenide films, among other materials. Epitaxial lift-off (ELO) films can be grown on wafers, then transferred to support surfaces. U.S. published application 2010/0219509 entitled "Tiled Substrates for Deposition and Epitaxial Lift Off Processes" by G. He and A. Hegedus, assigned to the assignee of the present invention and incorporated by reference herein, shows epitaxially grown film stacks transferred to a support substrate in a tiling pattern with gaps or streets between each of the ELO film stacks. An extensive list of support substrate materials is contained in the aforementioned published application.

SUMMARY

A method and a system for dicing semiconductor films is described, particularly where a support substrate is used. The substrate, preferably a polymer sheet is much thicker than the semiconductor film. The method and system apply two laser beams for backside laser cutting, in which the cut from the second laser beam is aligned with the cut from the first laser beam.

The first method is for dicing devices from a thin film semiconductor arrangement on a support substrate. The thin film is backed by a metal layer. The metal layer has a back surface bonded to a front surface of a translucent support substrate by an adhesive layer. The thin film has semiconductor devices in a desired areawise configuration thereupon with devices to be cut to a desired areawise size. The thin film has a front surface with scribe lines or streets or at least two reference marks defining device boundaries. The substrate has an exposed back surface.

The scribe lines or streets or reference marks (all called "scribe lines") are mapped from the front surface of the wafer to corresponding mapped locations on the back surface of the substrate. The scribe lines define the desired areawise extent of a cut to be made. One method of mapping is by machine vision.

An infrared laser beam is directed to cut by ablation or melting or otherwise from the back surface of the substrate. The infrared laser beam cuts from the back surface of the substrate through the substrate and through the adhesive layer approximately to the back surface of the metal layer. The metal layer and the semiconductor film remain essentially intact.

The semiconductor film and the infrared laser beam are moved relative to each other, to cut along one of the mapped scribe lines from the back surface of the substrate. The cutting forms a first trough along the mapped scribe line.

An ultraviolet laser beam is directed to cut from the back surface of the metal layer at the bottom of the first trough. The ultraviolet laser beam cuts through the metal layer and through the semiconductor film.

The semiconductor film and the ultraviolet laser beam are moved relative to each other, to cut along the mapped scribe line from the back surface of the metal layer. The cutting forms a second trough along the scribe line. The second trough extends from the bottom of the first trough and cuts through the surface of the semiconductor film, thereby separating one of the semiconductor devices from another of the semiconductor devices, each having a desired areawise extent.

In the case of dicing solar cells defined as upper layers upon a very thin wafer, the wafer is backed by a metal layer and is laminated to a translucent substrate. An adhesive layer bonds the substrate to the metal layer backing the wafer. A scribe line is defined on the wafer.

An infrared laser beam is aligned to the scribe line, from the back surface of the substrate. A backside street is cut along the scribe line, using the aligned infrared laser beam. The infrared laser beam cuts from the back surface of the flexible substrate, through the flexible substrate and through a majority of the thickness of the adhesive layer. The backside street has an initial trough.

An ultraviolet laser beam is aligned to the backside street, from the back surface of the flexible substrate. A further trough is cut along the scribe line, using the aligned ultraviolet laser beam. The further trough deepens the initial trough of the backside street along the scribe line. The ultraviolet laser beam cuts from a bottom of the initial trough through the metal layer and through the wafer. The initial trough deepened by the further trough dices the wafer and the flexible substrate, and separates one of the solar cells from another of the solar cells.

A system is described, for dicing solar cells from a semiconductor film having a plurality of solar cells. The system includes an imaging camera, an infrared laser beam, an ultraviolet laser beam, and a controller means. The semiconductor film has a metal layer backing. The metal layer is adhered to a substrate by an adhesive layer.

The infrared laser beam is configured to cut from a back surface of the substrate. The infrared laser beam is configured to cut through the substrate and through the majority of the thickness of the adhesive layer, in forming a first trough of a backside street. The semiconductor film and a majority of the thickness of the metal layer remain intact.

The ultraviolet laser beam is configured to cut from the bottom of the backside street. The ultraviolet laser beam has sufficient power to cut through the metal layer and through the semiconductor film, in forming a second trough of the backside street.

A controller cooperates with the imaging camera and the infrared and ultraviolet laser beams. The first trough of the backside street is cut, using the infrared laser beam. The back surface of the substrate is imaged. The ultraviolet laser beam is aligned to the backside street from the back surface of the substrate. Aligning the ultraviolet laser beam is based upon the imaging of the back surface of the substrate. The second trough of the backside street is cut, using the aligned ultraviolet laser beam. The semiconductor film is thereby diced. The film may have semiconductor devices that are diced, or opto-electronic devices, photovoltaic devices or solar cells.

DETAILED DESCRIPTION

Figure 1:
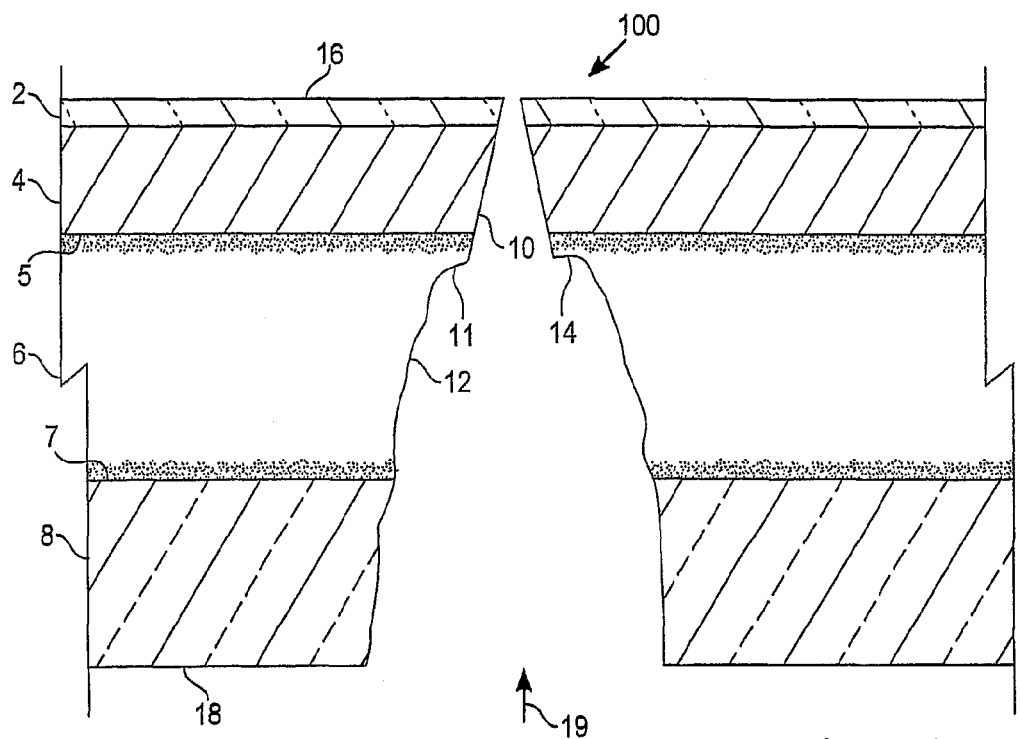
FIG. 1 is a cross-section view of a two beam backside laser cut as performed on a semiconductor film backed by a metal layer that is bonded to a translucent substrate by an adhesive layer, in accordance with the present invention.

With reference to FIG. 1, an ultrathin gallium arsenide film 2 of about two microns thickness is cut by laser, so that semiconductor devices on the film are diced and separated. The semiconductor devices could be electronic chips, opto-electronic devices or solar cells. In this example, the semiconductor devices are solar cells. The aligned two beam backside laser cut 100 is performed using two differing lasers, one of which makes the first backside cut 12 to form the first or initial trough of the backside street, the other of which makes the second backside cut 10 to form the second trough of the backside street. The second cut 10 and the second trough extend from the bottom 11 of the first cut 12 and the bottom of the first trough respectively, deepening the first cut 12 and the first trough to cut through the film 2 and separate the semiconductor devices.

The film 2 can be ELO semiconductor film fabricated as a solar cell and backed by a metal layer 4. In this example, the metal layer 4 contacts the P type semiconductor material, and forms the positive terminal of the solar cell. Metal traces (not shown in FIG. 1, but see FIG. 2) on the front surface 16 of the film 2 contact the N type semiconductor material and form the negative terminal of the solar cell.

The back surface 5 of the metal layer 4 is bonded to the front surface 7 of a translucent substrate 8 by an adhesive layer 6. In this example, the translucent substrate 8 is a sheet of PET (polyethylene terephthalate), a polymer material that is moderately flexible and quite dissimilar from the material of the semiconductor film. PET material is not thermally conductive, while the semiconductor film is moderately thermally conductive. PET is a thermoplastic polymer resin of the polyester family, and is in known use as a flexible substrate for thin films, thin and ultrathin wafers. Translucent is herein defined to include translucent or transparent materials. The flexible translucent substrate 8 provides support for the ultrathin gallium arsenide film 2 with metal layer 4 backing. In one example, after the solar cells are separated from the film 2, each solar cell retains a respective portion of the flexible substrate 8 with corresponding portion of the adhesive layer 6, and is mounted in a solar panel.

Example thicknesses for the stacked layers are two microns for the gallium arsenide film 2, twenty microns of copper for the metal layer 4, fifty microns for the adhesive layer 6 and fifty microns of PET for the flexible substrate 8.

Differing laser beams are used to perform two cuts 10 and 12. A first laser beam, aimed in a direction 19 towards the back surface 18 of the flexible substrate 8, makes a first cut as a first backside cut 12 from the back surface 18 of the flexible substrate 8. A second laser beam, aimed in a direction 19 towards the back surface 18 of the flexible substrate 8, makes a second cut as a second backside cut 12 from the back surface 18 of the flexible substrate 8. The lasers are selected and tuned for their abilities to cut through the respective layers and materials. Ultraviolet (UV) is a suitable wavelength for laser cutting of metals, but tends to pass through translucent and transparent materials. Infrared (IR) is a suitable wavelength for laser cutting of polymers, of which PET is a member, and adhesives, but tends to reflect off of metal.

An infrared laser provides a corresponding infrared laser beam as the first laser beam. The infrared laser beam cuts by ablation or by melting through the flexible substrate 8 and through the majority of the adhesive layer 6. In variations, the infrared laser beam cuts through the entirety of the thickness of the adhesive layer 6, or cuts through the thickness of the adhesive layer 6 and partially into the metal layer 4. The depth of the first cut, i.e. the first backside cut 12, is controlled so that a majority of or the entirety of the thickness of the metal layer remains intact. Thus, the infrared laser beam cuts approximately to the back surface of the metal layer, and the metal layer and the wafer remain essentially intact. A carbon dioxide laser that is continuous wave (CW) or pulsed may be used, at either a 10600 nm (nanometer or nanometers) or a 9400 nm wavelength. Cuts along a scribe line, which will be discussed with reference to FIG. 2, can be accomplished using a single-pass or a multi-pass process.

An ultraviolet laser provides a corresponding ultraviolet laser beam as the second laser beam. The ultraviolet laser beam cuts through the metal layer 4, and all the way through the film 2. In variations where a portion of the adhesive layer 6 remains after the completion of the first backside cut 12, the ultraviolet laser beam cuts through the portion of the adhesive layer 6 and then cuts through the metal layer 4 and through the film 2. A suitable wavelength for the ultraviolet laser is 355 nanometers, which has been successfully tested using the disclosed method for cutting through solar film layers with pulse widths in the picosecond range. The positioning and the depth of the second cut, i.e. the second backside cut 10, are controlled so that the second cut, extending from the bottom of the first cut, cuts completely through the wafer. Equivalently, the combination of the first backside cut 12 and the second backside cut 10 cuts completely from the back surface 18 of the flexible substrate 8 to and through the front surface 16 of the film 2. Laser power for both lasers is about 5 watts average power.

With the combination of the first backside cut 12 and the second backside cut 10 completely cutting through all of the layers of the stacked materials, the solar cells, ICs or other semiconductor devices fabricated on the wafer 2 become diced and can be separated mechanically from each other and from the wafer. A small amount of the thickness of the adhesive layer 6 remains in place in an overhang 14 in one embodiment, providing mechanical support for the corresponding portion of the metal layer 4 and film 2. The portion of the adhesive layer 6 remaining in the overhang 14 further protects the back surface 5 of the metal layer 4 from oxidation or other corrosion.

Each of the laser beams, namely the ultraviolet laser beam and the infrared laser beam, is adjusted to control the depth and width of the respective cut, by testing and calibration. As shown in FIG. 1, the beams can be adjusted so that the ultraviolet laser beam produces a narrower second backside cut 10 than the first backside cut 12 produced by the infrared laser beam. Laser beam spot size, wavelength, intensity and pulse duration can be selected and tuned to produce the indicated cut in the respective materials. In this manner, the amount of material removed from the semiconductor wafer 2 is minimized. The wider first backside cut 12 produced by the infrared laser beam, in comparison with the width of the frontside cut 10 produced by the ultraviolet laser beam, results in a greater tolerance of alignment error and greater likelihood of successful alignment of the second backside cut 10 with the first backside cut 12 as compared to a narrower first backside cut 12. Aiming of the respective lasers is directed during the performance of the respective cuts. The second backside cut 10 can be commenced immediately following the completion of the first backside cut 12, or after a delay or further processing of the wafer. In a variation, the second backside cut 10 is commenced while the first backside cut 12 is in progress, e.g. the first backside cut 12 proceeds cutting along a scribe line and forming the first trough of the backside street, and the second backside cut 10 commences cutting along the scribe line, following along the first trough of the backside street. Note that the second cut 10 is narrower than the first cut 12. This is partly due to a waveguiding effect wherein sidewalls become partly reflective and have a focusing effect of forwardly directed radiation. A top side kerf of 2 microns has been achieved.

Use of two, differing laser beams each optimized for cutting the respective materials reduces the total processing time for laser cutting and improves throughput as compared to a single laser beam process. As compared to a mechanical cutting process which can impart mechanical stresses and cause distortion or displacement to the solar film, the use of the two laser beams provides improved positioning accuracy and eliminates cracks associated with mechanical sawing and separation.

With the boundary of a solar cell defined by the laser cuts, the active area of the solar cell is maximized as compared to mechanical cutting and attendant loss of active area. Backside cutting results in a kerf that can be approximately 10% of the width of a front side laser cut. The process of laser cutting along a scribe line can be performed with or without the use of photolithographically deposited or laser ablated scribe line geometries, as will be described, or with or without streets left by tiling ELO thin film.

Figure 2:
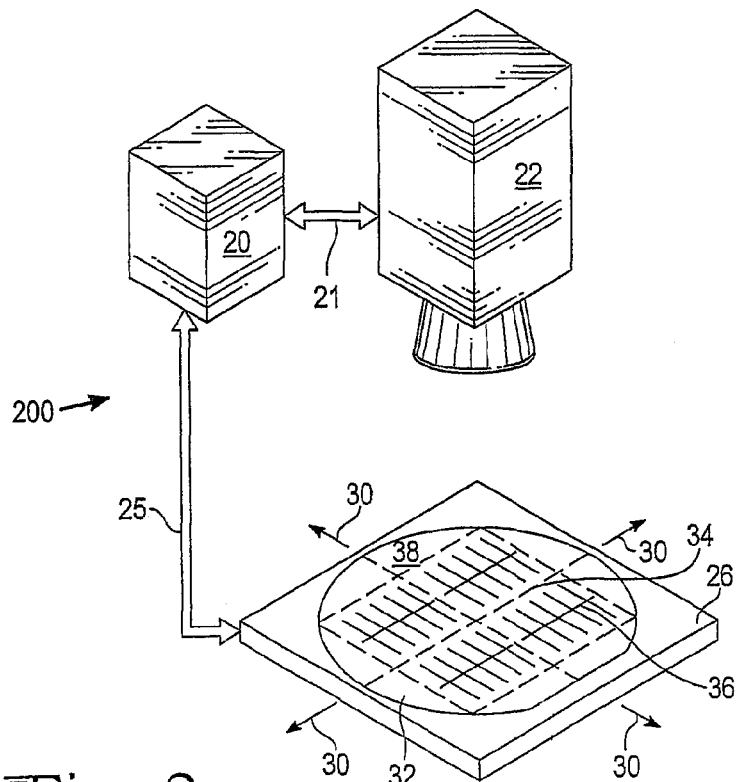
FIG. 2 is a perspective view of the front surface of the semiconductor film of FIG. 1, with a scribe line. Also shown is one embodiment of a machine vision system.

With reference to FIG. 2, a machine vision system 200 is shown imaging the front surface 38 of a semiconductor film 32. A scribe line 34 (shown in dashed lines) is defined on the film 32. A scribe line can be a virtual line defined by two reference points. Both of the backside cuts will be made along the scribe line 34, from the back surface of the flexible substrate. The machine vision system 200 includes a controller 20, an imaging camera 22 and a bidirectional communication path 21 between the controller 20 and the imaging camera 22. In one embodiment, a stage 26 supporting the film 32 is stationary or manually movable. In the embodiment shown, the stage 26 is movable and is controlled over a bidirectional communication path 25 by the controller 20. In variations, one or more of the communication paths is unidirectional.

A scribe line 34 is defined on the film. The scribe line can be shown or highlighted, i.e. physically represented, by photolithographically deposited or laser ablated scribe line geometries using known processes. In a variation, the scribe line is defined in the abstract e.g. as a pair of point coordinates relative to the wafer as determined using machine vision.

Various techniques can be used to align the infrared laser beam and the ultraviolet laser beam to the film 32 for cutting the first and second troughs of the backside street along the scribe line 34 from the back surface of the flexible substrate. Alignment can be performed before a laser beam is switched on, such as by positioning a laser, positioning a film, positioning a movable stage holding the film, or preparing data that will direct a laser beam or a movable stage.

In a first frontside alignment technique, the imaging camera 22 captures or forms an image of the exposed front surface 38 of the film 32, including metal traces 36 on the front surface 38 of the film 32. The metal traces 36 are, in this example, the buss bars of the negative terminal of the solar cell, and are in electrical contact with the N type material of the large PN diode junction that forms the solar cell. In further examples, the metal traces can be top layer metal interconnect on an integrated circuit or other previously deposited metal pattern on the front surface of the solar cell, die or film. In further examples, geometries other than metal traces could be used for image capturing.

Using machine vision, the controller 20 cooperates with the imaging camera 22 and produces a data in computer memory representing the image of the front surface 38 of the film 32. Various machine vision operations may be performed, such as imaging under various lighting conditions, x-ray, infrared or other types of imaging, 2-D or 3-D imaging, image processing, signal processing, grayscale or color intensity manipulation, edge enhancement, edge extraction, feature extraction, pattern matching, pattern recognition, orientation determination, linking, mapping, generation or determination of data sets, reference points, coordinates and so on. One or more reference points relative to the image of the front surface 38 of the film 32 can be determined, such as a starting point or an ending point for cutting the backside street along the scribe line 34, an intersection of two scribe lines or backside streets, a location along one of the metal traces 36 on the film 32. The location, orientation or other positioning of the scribe line 34 is determined relative to the image of the front surface 38 of the film 32.

Figure 3:
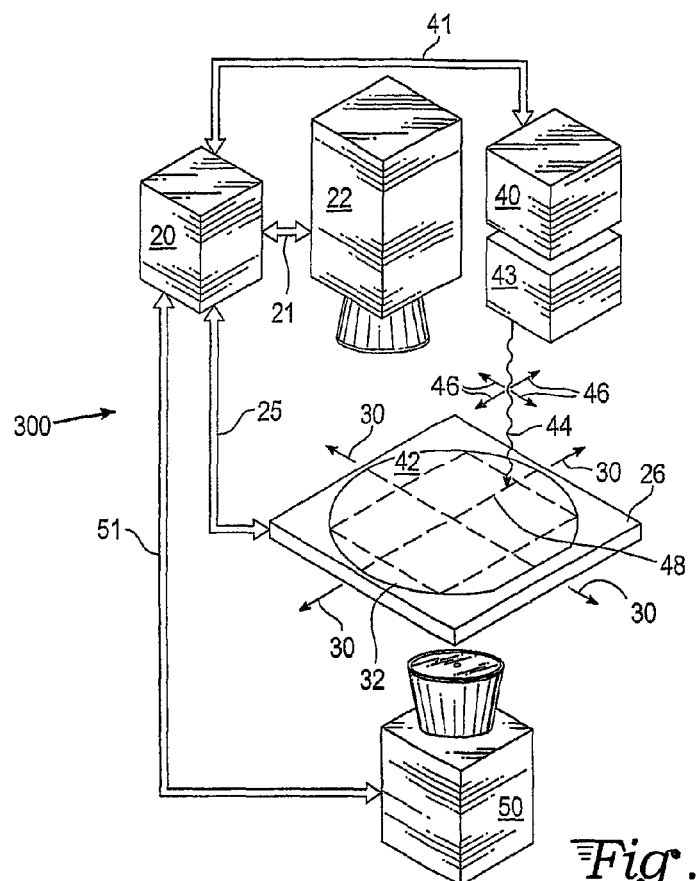
FIG. 3 is a perspective view of a laser cutting system performing a first backside cut, in a step of performing the laser cut of FIG. 1.

With reference to FIG. 3, a laser cutting system 300 is shown performing the first backside cut 12 as seen in FIG. 1. The laser cutting system 300 can reuse or integrate portions or the entirety of the machine vision system 200, or in variations can substitute alternative components for one or more of the components of the machine vision system 200. In a further variation, the laser cutting system 300 occupies a separate workstation or workspace from the machine vision system 200, and data is communicated from the machine vision system 200 to the laser cutting system 300. In a still further variation, data from a further source, such as design data or manufacturing data is communicated to the laser cutting system 300.

In the laser cutting system 300, a controller 20 has a bidirectional communication path 21 to an imaging camera 22, and a bidirectional communication path 41 to an infrared laser 40 and beam steering device 43. An infrared laser beam 44, produced by the infrared laser 40 and steered by the beam steering device 43, cuts along a scribe line 48 defined on the film 32. The cut is performed from the back surface 42 of the flexible substrate, through which the film 32 is visible in this example as a result of the flexible substrate and the adhesive layer being translucent. The infrared laser beam 44 and the film 32 are moved relative to each other, by moving the infrared laser beam 44 in various directions 46 and/or by moving the film 32 in various directions 30. In one embodiment, the infrared laser beam 44 is moved by beam steering optics as will be discussed with reference to FIG. 6, i.e. the beam steering device 43 includes beam steering optics, and the stage 26 is stationary. In a further embodiment, the beam steering device 43 includes a set of actuators that move the infrared laser 40, thereby moving the infrared laser beam 44. In a still further embodiment, the film 32 is moved by a movable stage 26 controlled by the controller 20 over a bidirectional communication path 25. In further embodiments, both the film 32 and the infrared laser beam 44 are movable. In variations, one or more of the communication paths is unidirectional.

Recall that a scribe line 34 is defined on the film 32. The scribe line 34 can be represented in a data set e.g. as at least two points or coordinates relative to the film 32. In some embodiments, the scribe line 34 is represented physically on a film 32 as by photolithographically deposited scribe line geometries. Similarly, a scribe line 48 is defined on the film 32, and is used in cutting the first and second troughs of the backside street. The scribe line 48 is mapped from the scribe line 34, as by mapping from the front surface 38 of the film 32 to the back surface 42 of the flexible substrate. The scribe line 48 can be represented in a data set e.g. as coordinates relative to the film 32. Conceptually, the scribe line 48 can be thought of as "the same" as the scribe line 34, with the difference being that the scribe line 34 can be defined relative to the front surface 38 of the film and the scribe line 48 is used for cutting the backside street. The mapping is used for coordinating data sets relative to the front surface 38 of the film 32 and the back surface 42 of the flexible substrate, and for operating the laser cutting system or systems. With this mapping, the scribe line 48 aligns with the scribe line 34, so that the cuts made along the backside street are aligned to each other and do not interfere with circuitry defined by geometries such as metal traces 36 on the front surface 38 of the film 32. With the second backside cut 10 aligning to the first backside cut 12, and both the second backside cut 10 and the first backside cut 12 aligning to the scribe line 34 and to the mapped scribe line 48, the first and second backside cuts 10, 12 can overlap all along the scribe line 34, thereby severing one semiconductor device from another semiconductor device.

In FIG. 3, the laser cutting system 300 is shown implementing a first backside alignment technique. An imaging camera 50 images the front surface of the film 32, through the stage 26 that is supporting the film 32, while the back surface 42 of the flexible substrate faces upward towards a further imaging camera 22 and an infrared laser 40. The stage 26 can be transparent or have a transparent window or an opening through which the front surface of the film 32 is visible to the imaging camera 50. In a variation, the front surface of the film 32 is facing upward and the imaging camera 50 is mounted above the film 32, while the infrared laser 40 is mounted below the film 32. In a still further variation, the wafer is oriented vertically rather than horizontally and held by one or more edges in a holder. In a further embodiment, the laser cutting system 300 is equipped with both an infrared laser and an ultraviolet laser and performs both the first and second backside cuts. The ultraviolet laser can be positioned facing the front surface of the substrate, in such an embodiment.

The controller 20, cooperating and communicating with the imaging camera 50 over a bidirectional communication path 51, uses machine vision and produces a data set relative to the image of the front surface 38 of the film 32, in a manner similar to that of the machine vision system 200. At least two reference points relative to the image of the front surface 38 of the film 32 are determined, such as points equidistant from metal traces of adjacent solar cells, points along one of the scribe lines, points at intersections of scribe lines, or locations along one of the metal traces.

In variations, the ultraviolet laser beam 27 is aligned to the scribe line 34 from the back surface 42 of the flexible substrate by recognizing, on the front surface of the wafer, the metal traces 36, photolithographically deposited scribe line geometries or alignment targets (not shown), or other feature or features imaged and processed by machine vision.

In preparation for cutting the first trough of the backside street i.e. the trough of the first backside cut 12, the controller 20 links the scribe line 48, as mapped from the scribe line 34, to the reference point and may link to further reference points. The controller 20 prepares data for guiding the infrared laser beam 44 based upon the linking of the scribe line 48 to the reference point. The infrared laser 40 and the imaging camera 50 are calibrated relative to each other or relative to a shared coordinate system or grid, so that the infrared laser 40 can be operated and the infrared laser beam 44 guided by the controller 20 using data from the imaging camera 50. In a variation as shown, a further imaging camera 22, connected to the controller 20 by a bidirectional communication path 21, is used to verify, determine or arrange positioning of the film 32. The infrared laser beam 44 is aligned to each of the film 32, the scribe line 34 and the mapped scribe line 48, from the back surface 42 of the flexible substrate.

Figure 4:
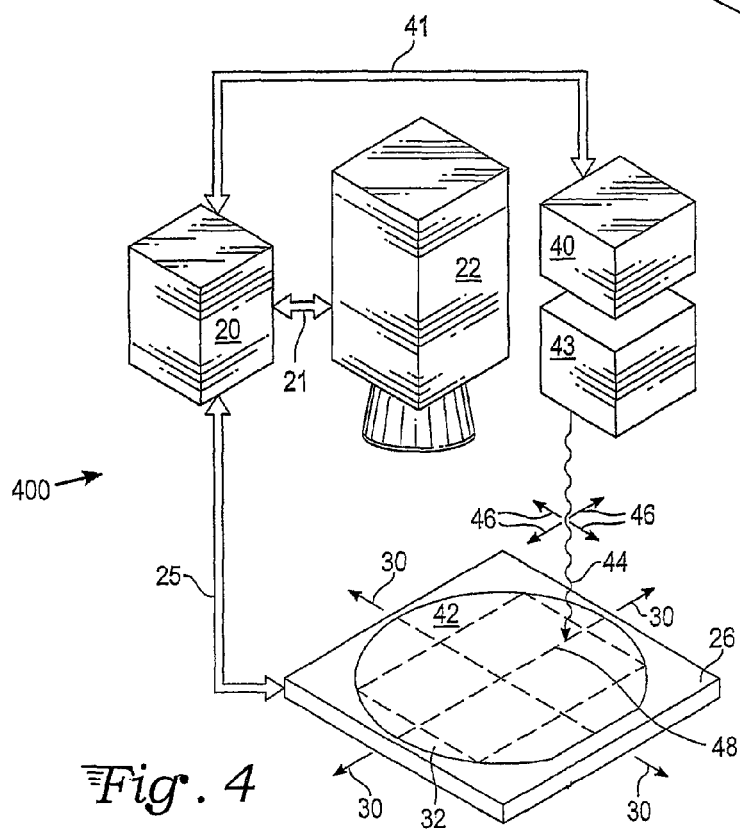
FIG. 4 is a perspective view of a further laser cutting system performing a first backside cut, in a variation of a step of performing the laser cut of FIG. 1.

With reference to FIG. 4, a laser cutting system 400 is shown implementing a second backside alignment technique as a variation of the first backside alignment technique. The imaging camera 22 captures an image of the back surface 42 of the flexible substrate. The infrared laser beam 44 is aligned from the back surface 42 of the flexible substrate to the scribe line 34, by mapping the scribe line 34 to the back surface 42 of the flexible substrate using machine vision. The scribe line 48, as used in cutting the backside street, is a mapped scribe line as mapped to the back surface 42 of the flexible substrate from the scribe line 34. In a first mapping technique, the scribe line 34 is mapped from the front surface 38 of the film 32, using the machine vision system 200 and data produced thereby. In a second mapping technique, the scribe line 34 is mapped from the front surface 38 of the film 32, using an average or ideal wafer, a test fixture, or design data. At least two first reference points are determined relative to the image of the back surface 42 of the flexible substrate. The scribe line 48, as mapped from scribe line 34, is linked to the first reference point. The controller 20 prepares data for guiding the infrared laser beam 44 based upon the linking of the mapped scribe line 48 to the first reference point. In this manner, the infrared laser beam 44 is aligned to the film 32 from the back surface 42 of the flexible substrate, and is aligned from the back surface 42 of the flexible substrate to the mapped scribe line 48. The infrared laser 40 and beam steering device 43 have similar features and actions to the respective devices of the laser cutting system 300. In a variation, the imaging camera 22 is omitted, and the wafer 32 is aligned manually or by dead reckoning from coordinates determined from when the wafer was at another location. In dead reckoning, reference features are used to directly instruct a galvo scanner. Such variations of the system may trade off cost, speed and accuracy, by omitting the imaging camera 22.

Figure 5:
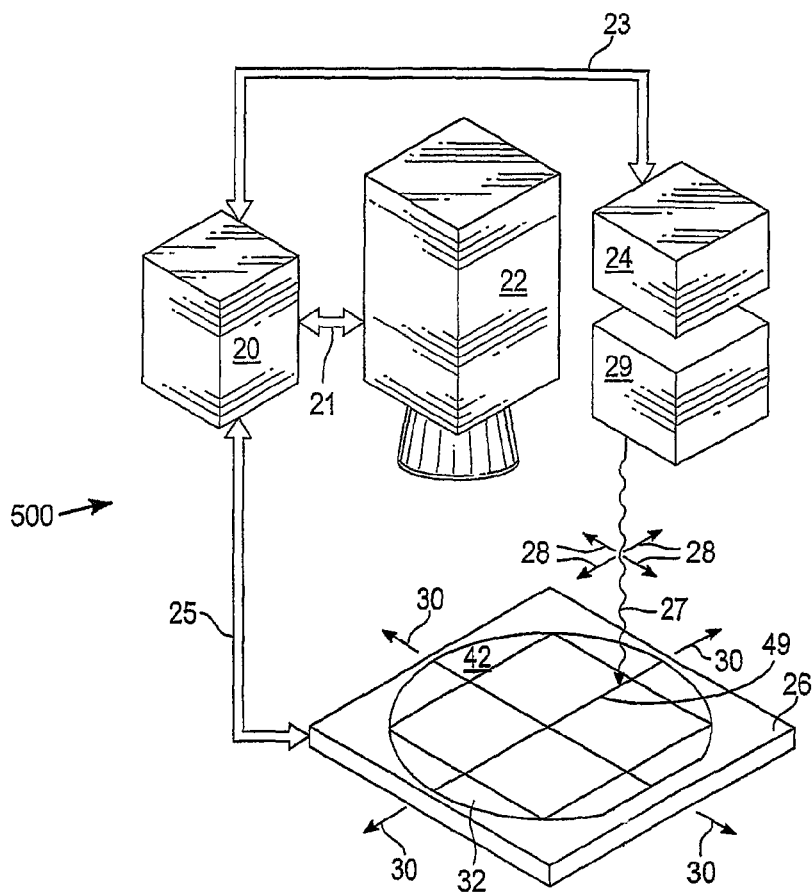
FIG. 5 is a perspective view of a laser cutting system performing a second backside cut, in a step of performing the laser cut of FIG. 1.

With reference to FIG. 5, a laser cutting system 500 is shown performing the second backside cut 10 as seen in FIG. 1. A controller 20 has a bidirectional communication path 21 to an imaging camera 22, and a bidirectional communication path 23 to an ultraviolet laser 24 and beam steering device 29. An ultraviolet laser beam 27, produced by the ultraviolet laser 24 and steered by the beam steering device 29, cuts along the mapped scribe line as delineated by the trough of the first backside cut 12, i.e. the first trough 49 of the backside street. The first trough 49 of the backside street performs a physical and optically visible mapping of the scribe line 34 from the front surface of the film 32 to the back surface 42 of the flexible substrate, and thus physically represents the mapped scribe line 48. The ultraviolet laser beam 27 is aligned with each of the scribe line 34, the mapped scribe line 48, the film 32 and the first trough 49 of the backside street, from the back surface 42 of the flexible substrate. The cut, i.e. the second backside cut 10, is performed from the back surface 42 of the flexible substrate. The ultraviolet laser beam 27 and the film 32 are moved relative to each other, by moving the ultraviolet laser beam 27 in various directions 28 and/or by moving the film 32 in various directions 30. In one embodiment, the ultraviolet laser beam 27 is moved by beam steering optics as will be discussed with reference to FIG. 6, i.e. the beam steering device 29 includes beam steering optics, and the stage 26 is stationary. In a further embodiment, the beam steering device 29 includes a set of actuators that move the ultraviolet laser 24, thereby moving the ultraviolet laser beam 27. In a still further embodiment, the film 32 is moved by a movable stage 26 controlled by the controller 20 over a bidirectional communication path 25, and the ultraviolet laser beam 27 is stationary. In further embodiments, both the stage 26 and the ultraviolet laser beam 27 are movable. In variations, one or more of the communication paths is unidirectional.

Various techniques can be used to align the ultraviolet laser beam 27 to the film 32 for cutting the second trough of the backside street along the scribe line 48 and along the first trough 49 of the backside street, from a back surface 42 of the flexible substrate. In a third backside alignment technique, the imaging camera 22 captures or forms an image of the exposed back surface 42 of the flexible substrate. The image of the back surface 42 of the flexible substrate includes imaging of the first trough 49 of the backside street, which is visible from the back surface 42 of the flexible substrate.

Using machine vision, the controller 20 cooperates with the imaging camera 22 and produces a second data set relative to the image of the back surface 42 of the flexible substrate and the first trough 49 of the backside street that is visible therefrom. At least a second reference point relative to the image of the back surface 42 of the flexible substrate is determined, such as a starting point or an ending point for cutting the second trough of the backside street along the scribe line 48, an intersection of two scribe lines or backside streets, or a point along the first trough 49 of the backside street.

In preparation for cutting the second trough of the backside street, the controller 20 links the mapped scribe line 48 to the second reference point and may link to further reference points. The controller 20 prepares data for guiding the ultraviolet laser beam 27 based upon the linking of the mapped scribe line 48 to the second reference point. In this manner, the ultraviolet laser beam 27 is aligned to the film 32 from the back surface 42 of the flexible substrate, is aligned to the mapped scribe line 48 from the back surface 42 of the flexible substrate, is aligned to the scribe line 34, and is aligned to the first trough 49 of the backside street that is visible from the back surface 42 of the flexible substrate.

With reference to FIGS. 2-5, the laser cutting systems 300, 400, 500 have variations with fixed or movable stages 26, other types of holders, horizontal, vertical or angled mountings of the film 32 and further arrangements of imaging cameras, lasers and controllers. The controller can include multiple controller units, integrated or distributed processing and controlling, hardware, software, firmware and combinations thereof. The first and second backside cuts can be performed by separate systems or by one integrated system. In one example of an integrated system, a controller interacts with an infrared laser, an ultraviolet laser and an imaging camera, with the imaging and the laser beams arranged to interact with the film 32 from the back surface 42 of the flexible substrate. In a variation of the integrated system, a further imaging camera is arranged to image the front surface 38 of the film 32. In a further variation of the integrated system, an imaging camera is arranged to image the front surface 38 of the wafer 32, and the infrared laser beam and the ultraviolet laser beam are calibrated to align to the film from the back surface 42 of the flexible substrate using the imaging of the front surface 38 of the film 32.

Figure 6:
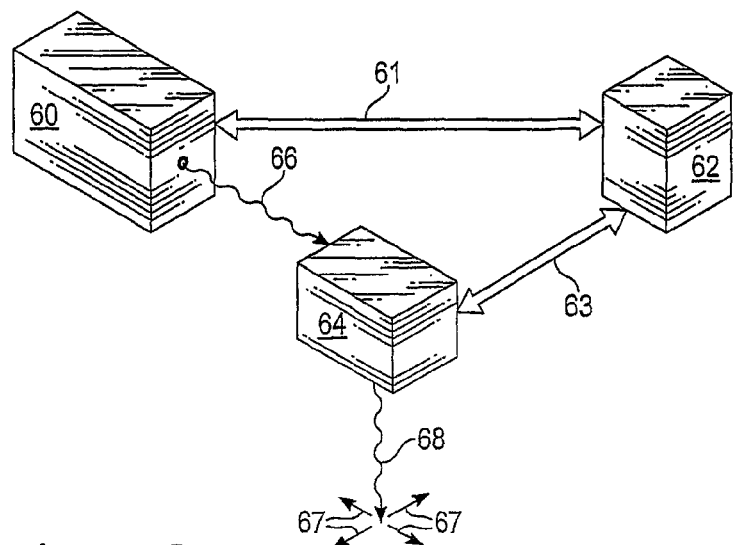
FIG. 6 is a perspective view of a laser scanner with beam steering optics, as used in a variation of the laser cutting systems of FIGS. 2-5.

With reference to FIG. 6, a two dimensional laser scanner 600 is shown. The two-dimensional laser scanner 600 can be used for moving a laser beam, such as in any of the laser cutting systems 300, 400, 500 or variations thereof. A controller 62 cooperates with a laser 60 over a bidirectional communication path 61 and cooperates with a beam steering optics unit 64 over a bidirectional communication path 63. A laser beam 66 from the laser 60 enters the beam steering optics unit 64, and a movable laser beam 68 exits the beam steering optics unit 64. The movable laser beam 68 can be moved in various directions 67, as directed by the controller 62.

The contents of the beam steering optics unit 64 can include a rotating mirrored drum, one or more steerable mirrors, one or more steerable lenses, and motors, galvanometric or other actuators as appropriate, or other known mechanisms for steering a laser beam, and various combinations. Examples of such steerable mirrors include a first mirror that tilts along a first axis to control a reflected laser beam in an X direction, followed by a second mirror that tilts along a second axis to control a reflected laser beam in a Y direction, the assembly thus controlling a laser beam in X and Y directions. Examples of mirrored drums include octagonal and other polygonal cross-section drums with mirrored faces, with the drums spinning to scan a laser beam in a linear manner. The laser beam can be scanned orthogonally to the scan produced by the rotating mirrored drum, by using an orthogonally positioned further rotating mirrored drum or a steerable mirror. One or more passive reflecting mirrors can be incorporated to fold, redirect or otherwise rearrange a beam path. The laser 60 can be switched on and off by the controller 62. In a variation, the beam steering optics unit 64 has a shutter or deflecting mirror (not shown, but readily devised) that can switch the movable laser beam 68 on and off. Various embodiments of the laser 60 and the beam steering optics unit 64 can be used in the laser cutting systems 300, 400, 500 as the respective laser and beam steering device therein, with the controller 62 communicating with or integrated with the controller of such a system.

Figure 7A:
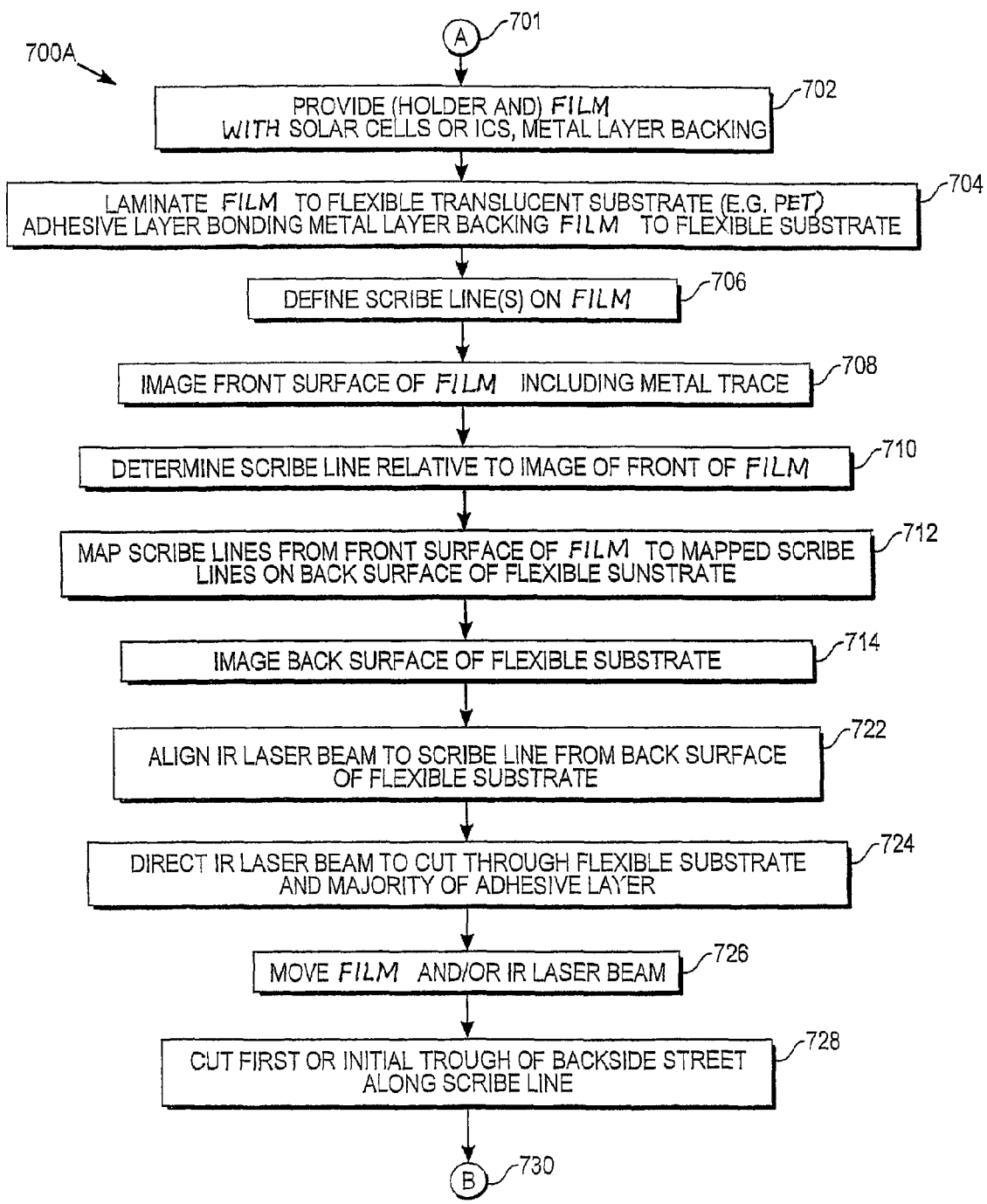
FIGS. 7A and 7B are a flow diagram of a method of performing a two beam backside laser cut as shown on the semiconductor film in FIG. 1.
Figure 7B:
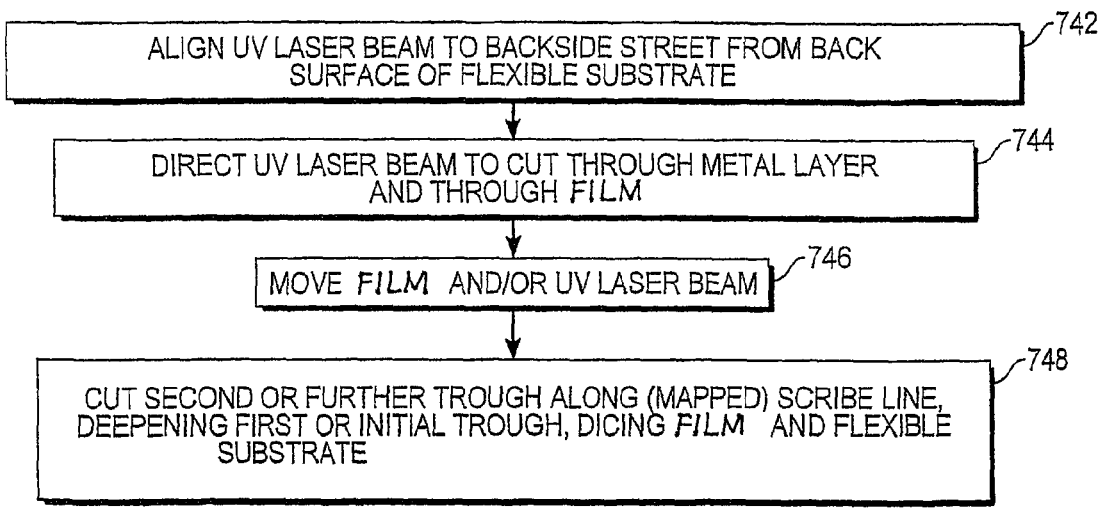

With reference to FIGS. 7A and 7B, a method 700A and 700B of performing a two beam backside laser cut on a semiconductor film or wafer is shown, as can be practiced using the laser cutting systems 300, 400, 500 and variations thereof. The method 700A corresponds to the first or initial backside laser cut and the method 700B corresponds to the second or further backside laser cut. Variations of the method use some of the steps, combine some of the steps or change the sequences of some of the steps.

With reference to FIG. 7A, the method 700A for performing the first or initial backside laser cut starts at entry point "A" 701 and has blocks as shown. In a block 702, a semiconductor film is provided, and a holder is provided. The semiconductor film has solar cells or integrated circuits (ICs). The wafer has a metal layer backing. In a block 704, the film is laminated to a flexible translucent substrate, for example PTE. The lamination has an adhesive layer bonding the metal layer, backing the film, to the flexible substrate. In a block 706, a scribe line is defined on the film. In a block 708, the front of the film is imaged, including a metal trace. In a block 710, the scribe line is determined relative to the image of the front of the film. In a block 712, the scribe lines are mapped from the front surface of the film to mapped scribe lines on the back surface of the flexible substrate. In a block 714, the back surface of the flexible substrate is imaged. References points are determined in defining scribe lines and actual scribe lines are not intended, per se, but rather cutting paths. In a block 722, an IR laser beam is aligned to the scribe line from the back surface of the flexible substrate. In a block 724, the IR laser beam is directed to cut through the flexible substrate and the majority of the adhesive layer. In a block 726, the film and/or the IR laser beam is moved. In a block 728, the first or initial trough of the backside street is cut along the scribe line.

With reference to FIG. 7B, a continuation of FIG. 7A, starts at entry point "B" 730 and has blocks as shown. In a block 742, the UV laser beam is aligned to the backside street from the back surface of the flexible substrate. In a block 744, the UV laser beam is directed to cut through the metal layer and through the film. In a block 746, the film and/or the UV laser beam is moved. In a block 748, the second or further trough of the backside street is cut along the (mapped) scribe line, deepening the first or initial trough and dicing the film and flexible substrate. The film devices are thereby separated. While an ultraviolet laser has been described as having the preferred wavelength for cutting a semiconductor film, other wavelengths may be used including suitable visible wavelengths, particularly green. Instead of an infrared laser, another wavelength in the visible spectrum, different from the first laser may be used and selected by matching absorption by the substrate.

What is claimed is:

1. A method for dicing supported semiconductor devices, comprising:

providing a holder supporting a semiconductor film backed by a metal layer having a back surface bonded to a front surface of a substrate, the semiconductor film having semiconductor devices thereupon and having a front surface with reference features defining real or virtual device boundaries, and the substrate having an exposed back surface;

mapping the reference features from the front surface of the semiconductor film to corresponding mapped device boundaries on the back surface of the substrate, by using machine vision to form an image of the back surface of the substrate and data relating thereto; and determining at least two reference points on the image of the back surface of the substrate, wherein the mapped reference features as applied to forming the first trough are at least partially based upon the two reference points;

directing a laser beam having a first wavelength to cut from the back surface of the substrate through the substrate approximately to the back surface of the metal layer, such that the metal layer and the semiconductor film remain essentially intact;

moving the semiconductor film and the laser beam of the first wavelength relative to each other to cut using the mapped device boundaries from the back surface of the substrate and form a first trough;

directing an laser beam of a second wavelength, different from the first wavelength, to cut from a back surface of the metal layer at a bottom of the first trough through the metal layer and through the semiconductor film; and moving the semiconductor film and the laser beam of the second wavelength relative to each other to cut using the mapped device boundaries from the back surface of the metal layer and form a second trough using the mapped device boundaries, the second trough extending from the bottom of the first trough and cutting through the surface of the semiconductor film thereby separating the semiconductor devices from one another.

2. The method of claim 1 wherein the first wavelength is infrared.

3. The method of claim 2 wherein the semiconductor devices are solar cells.

4. The method of claim 1 wherein the second wavelength is ultraviolet.

5. The method of claim 1 wherein the mapped reference features as applied to forming the second trough are at least partially based upon the two reference points.

6. The method of claim 1 further comprising configuring an infrared laser and an ultraviolet laser to produce the laser beam of the first wavelength and the laser beam of the second wavelength respectively such that the second trough is narrower than the first trough.

7. A method for dicing solar cells from a semiconductor substrate, comprising:

providing a semiconductor film that has a plurality of solar cells thereupon and is backed by a metal layer, the semiconductor film having a front surface;

laminating the semiconductor film to a substrate to bond the substrate to the metal layer backing the film, the substrate having a back surface;

using machine vision to produce an image of the back surface of the substrate;

determining at least two reference points on the image of the back surface of the substrate to define scribe lines for cutting the backside cut;

establishing reference features on the semiconductor film;

aligning an infrared laser beam to the reference features from the back surface of the substrate;

cutting a backside street with reference to the reference features using the aligned infrared laser beam to cut from the back surface of the substrate through the substrate, the backside cut having an initial trough;

aligning an ultraviolet laser beam to the backside cut from the back surface of the substrate; and cutting a further trough that deepens the initial trough of the backside cut with reference to the reference features, using the aligned ultraviolet laser beam to cut from a bottom of the initial trough through the metal layer and through the semiconductor film so that the initial trough deepened by the further trough dices the semiconductor film and substrate and separates one of the solar cells from another of the solar cells.

8. The method of claim 7 wherein the semiconductor film is a gallium arsenide ELO film.

9. The method of claim 7 further comprising using reference features in cutting the further trough of the backside cut.

10. The method of claim 7 wherein the semiconductor film is integral with a semiconductor wafer.

11. The method of claim 7 further comprising imaging from the back surface of the substrate the initial trough of the backside cut, wherein aligning the ultraviolet laser beam is based upon the imaging of the initial trough of the backside cut from the back surface of the substrate.

* * * * *